US011810808B2

(12) United States Patent
Trujillo et al.

(10) Patent No.: US 11,810,808 B2
(45) Date of Patent: Nov. 7, 2023

(54) APPARATUS AND METHOD FOR FACILITATING PLANAR DELAYERING OF INTEGRATED CIRCUIT DIE

(71) Applicant: HONEYWELL FEDERAL MANUFACTURING & TECHNOLOGIES, LLC, Kansas City, MO (US)

(72) Inventors: Joshua Joseph Trujillo, Belton, MO (US); Robert Allen Williams, Belton, MO (US)

(73) Assignee: HONEYWELL FEDERAL MANUFACTURING & TECHNOLOGIES, LLC, Kansas City, MO (US)

( * ) Notice: Subject to any disclaimer, the term of this patent is extended or adjusted under 35 U.S.C. 154(b) by 279 days.

(21) Appl. No.: 16/669,851

(22) Filed: Oct. 31, 2019

(65) Prior Publication Data

US 2020/0144091 A1 May 7, 2020

Related U.S. Application Data

(62) Division of application No. 16/180,734, filed on Nov. 5, 2018, now Pat. No. 10,573,547.

(51) Int. Cl.
*H01L 21/683* (2006.01)
*H01L 21/306* (2006.01)

(52) U.S. Cl.
CPC .... *H01L 21/6835* (2013.01); *H01L 21/30604* (2013.01); *H01L 21/30625* (2013.01); *H01L 2221/68313* (2013.01)

(58) Field of Classification Search
CPC ............................................. H01L 2221/68313
See application file for complete search history.

(56) References Cited

U.S. PATENT DOCUMENTS

| 2004/0140533 | A1* | 7/2004 | Stern | H01L 21/6835 257/620 |
| 2005/0112847 | A1* | 5/2005 | Moriceau | H01L 21/76254 438/458 |
| 2009/0077796 | A1* | 3/2009 | Sakamoto | H01L 24/27 29/832 |
| 2016/0133496 | A1* | 5/2016 | Lambert | H01L 24/03 257/619 |
| 2019/0318951 | A1* | 10/2019 | Chang | H01L 21/6835 |

* cited by examiner

*Primary Examiner* — Moazzam Hossain
(74) *Attorney, Agent, or Firm* — HOVEY WILLIAMS LLP

(57) ABSTRACT

An apparatus and method for facilitating the removal of layers from a die for an integrated circuit while maintaining the planarity of the surface of the die by avoiding rounding the corners and other edges of the die. A pocket is created in a sacrificial material, such that when the die is inserted into the pocket the edges of the die are contiguous with the walls of the pocket and a top surface of the die is coplanar with a top surface of the pocket. The sacrificial material may be the same material as the die. An adhesive substance is placed in the pocket, and the die is inserted into the pocket and against the adhesive substance which aids in retaining the die in the pocket. The layers may then be removed from the die and the sacrificial material around the die without rounding the edges of the die.

12 Claims, 3 Drawing Sheets

APPARATUS AND METHOD FOR FACILITATING PLANAR DELAYERING OF INTEGRATED CIRCUIT DIE

RELATED APPLICATIONS

The present U.S. patent application is a divisional application and claims priority benefit of a prior-filed U.S. non-provisional patent application having the same title, Ser. No. 16/180,734, filed Nov. 5, 2018. The entire content of the identified prior-filed application is hereby incorporated by reference as if fully set forth herein.

STATEMENT REGARDING FEDERALLY-SPONSORED RESEARCH OR DEVELOPMENT

This invention was made with government support under Contract No.: DE-NA0000622 awarded by the Department of Energy. The government has certain rights in the invention.

FIELD

The present invention relates to integrated circuits, and more particularly, embodiments concern an apparatus and method for facilitating the removal of one or more layers from a die for an integrated circuit while maintaining the planarity of the surface of the die.

BACKGROUND

It is sometimes desirable to remove one or more layers from an integrated circuit die, and the delayering process is performed using mechanical or chemical means. However, it is also desirable that the surface of the die remain planar during the delayering process, which can be difficult given the extremely small size of the die, and in practice, the edges of the die often become rounded.

This background discussion is intended to provide information related to the present invention which is not necessarily prior art.

SUMMARY

Embodiments address the above-described and other problems by providing an apparatus and method for facilitating the removal of one or more layers from a die for an integrated circuit while maintaining the planarity of the surface of the die. Embodiments advantageously avoid rounding the corners and other edges of the die or otherwise negatively affecting the planarity of the surface of the die. Instead, any such negative effects are directed toward a sacrificial material around the die.

In a first embodiment, a method is provided for removing one or more layers from a die for an integrated circuit. The method may include the following steps. A pocket may be created in a sacrificial material, wherein the pocket substantially conforms to a shape of the die. An adhesive substance may be positioned in the pocket. The die may be inserted into the pocket and against the adhesive substance, wherein the adhesive substance adheres to a bottom of the die and aids in retaining the die in the pocket. The one or more layers may be removed from the die and the sacrificial material surrounding the die without rounding the edges of the die.

Various implementations of the first embodiment may include any one or more of the following additional features. The pocket may be no more than ten millimeters square and no more than five thousand microns deep. The pocket may be created by removing an amount of the sacrificial material, or by building up an amount of the sacrificial material around the die. The sacrificial material may be a same material as the die, and may include silicon. The adhesive substance may be a wax substance. The wax substance may initially be in an unsolidified state, and the method may further include maintaining the die in a desired position and orientation within the pocket until the wax substance cools to a solidified state.

In a second embodiment, an apparatus is provided for removing one or more layers from a die for an integrated circuit. The apparatus may include a pocket and an adhesive substance. The pocket may be created in a sacrificial material, wherein the pocket substantially conforms to a shape of the die such that when the die is inserted into the pocket, an edge of the die is contiguous with a wall of the pocket and a top surface of the die is coplanar with a top surface of the pocket. The adhesive substance may be positioned in the pocket. In operation, the die may be inserted into the pocket and against the adhesive substance which adheres to a bottom of the die and aids in retaining the die in the pocket, and the one or more layers may be removed from the die and the sacrificial material surrounding the die without rounding the edges of the die.

Various implementations of the second embodiment may include any one or more of the following additional features. The pocket may be no more than ten millimeters square and no more than five thousand microns deep. The pocket may be created by removing an amount of the sacrificial material, or by building up an amount of the sacrificial material around the die. The sacrificial material may be a same material as the die, and may include silicon. The adhesive substance may be a wax substance. The wax substance may initially be in an unsolidified state, and the die may be maintained in a desired position and orientation within the pocket until the wax substance cools to a solidified state. The apparatus may further include a base underlying and supporting the sacrificial material.

This summary is not intended to identify essential features of the present invention, and is not intended to be used to limit the scope of the claims. These and other aspects of the present invention are described below in greater detail.

DRAWINGS

Embodiments of the present invention are described in detail below with reference to the attached drawing figures, wherein.

Figure 4:
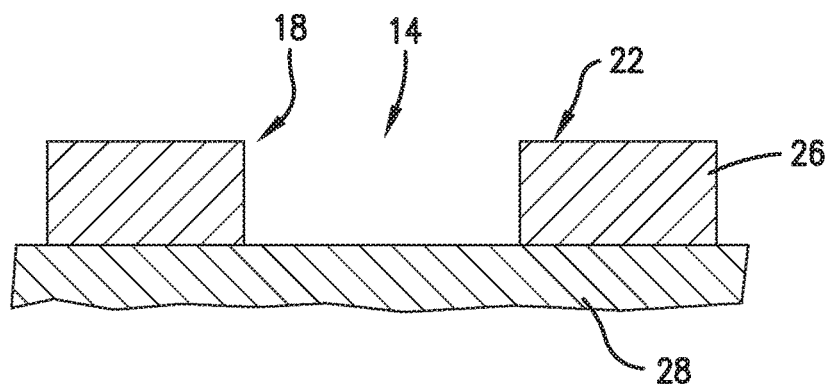
FIG. 4 is a fragmentary cross-sectional elevation view of a pocket created by adding material.
Figure 6:
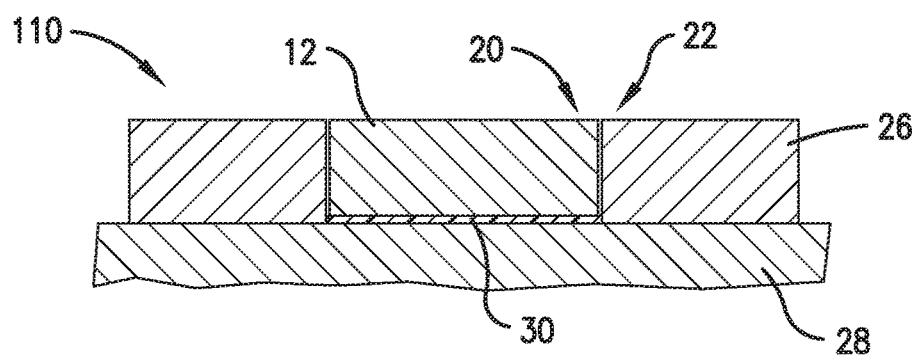
Figure 7:
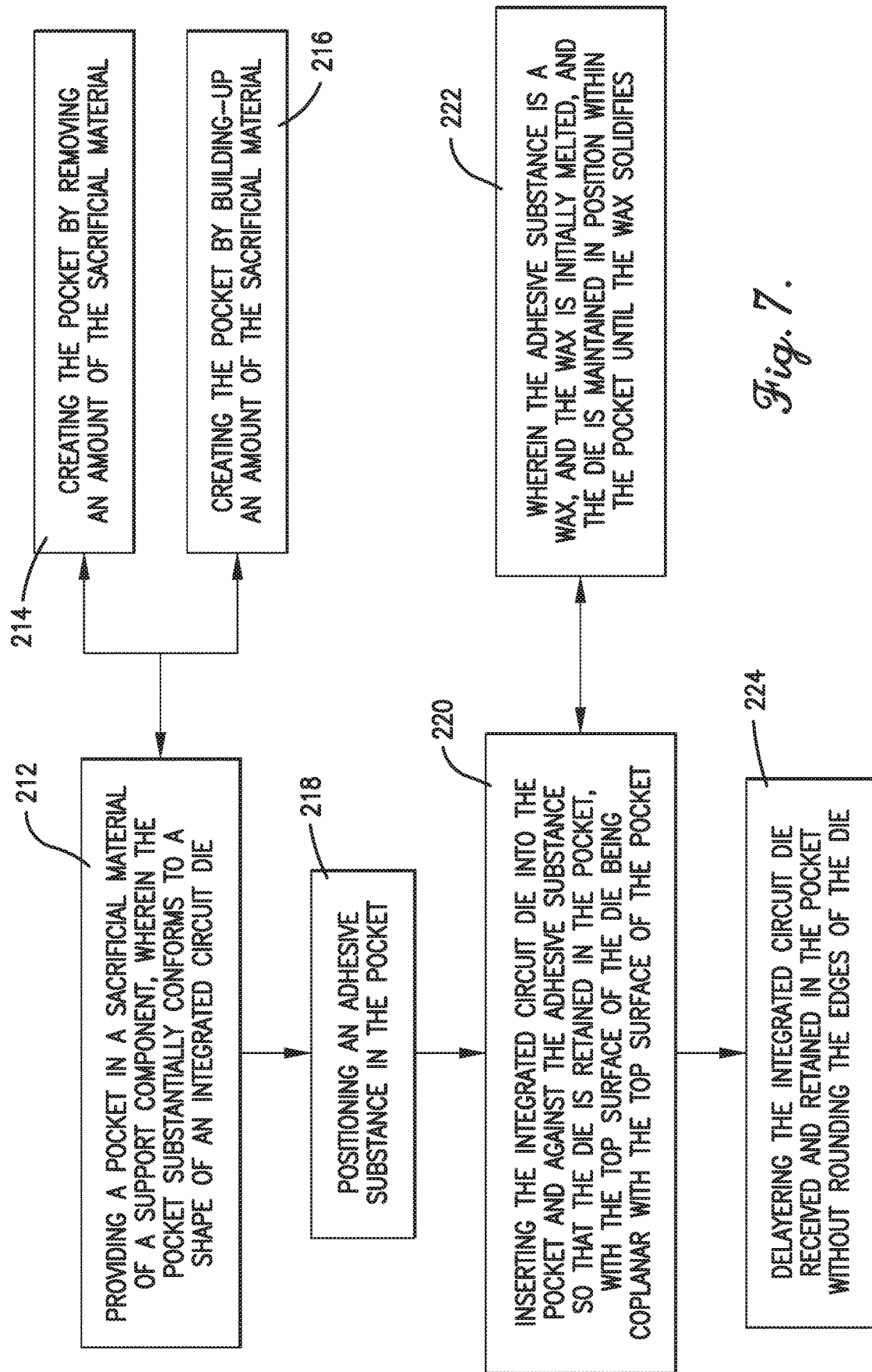

FIG. 6 is a fragmentary cross-sectional elevation view of a second embodiment of an apparatus for facilitating planar delayering of the integrated circuit die, wherein the integrated circuit die is fully inserted into the pocket of FIG. 4 and maintained in a desired position and orientation by the adhesive substance; and FIG. 7 is a flowchart of steps involved in an embodiment of a method for facilitating planar delayering of an integrated circuit die.

The figures are not intended to limit the present invention to the specific embodiments they depict. The drawings are not necessarily to scale.

DETAILED DESCRIPTION

The following detailed description of embodiments of the invention references the accompanying figures. The embodiments are intended to describe aspects of the invention in sufficient detail to enable those with ordinary skill in the art to practice the invention. Other embodiments may be utilized and changes may be made without departing from the scope of the claims. The following description is, therefore, not limiting. The scope of the present invention is defined only by the appended claims, along with the full scope of equivalents to which such claims are entitled.

In this description, references to "one embodiment," "an embodiment," or "embodiments" mean that the feature or features referred to are included in at least one embodiment of the invention. Separate references to "one embodiment," "an embodiment," or "embodiments" in this description do not necessarily refer to the same embodiment and are not mutually exclusive unless so stated. Specifically, a feature, component, action, step, etc. described in one embodiment may also be included in other embodiments, but is not necessarily included. Thus, particular implementations of the present invention can include a variety of combinations and/or integrations of the embodiments described herein.

Broadly characterized, the present invention provides a system and method for improving the process of delayering dies for integrated circuits. More particularly, embodiments concern an apparatus and method for facilitating the removal of one or more layers from a die for an integrated circuit while maintaining the planarity of the surface of the die. Embodiments advantageously avoid rounding the corners and other edges of the die or otherwise negatively affecting the planarity of the surface of the die. Instead, any such negative effects are directed toward a sacrificial material around the die.

Referring to the figures, embodiments of an apparatus 10, 110 and method 210 are shown for facilitating the removal of one or more layers from an integrated circuit die 12. A pocket or other cavity 14 may be created or otherwise provided which substantially conforms to a shape of the integrated circuit die 12, as shown in 212 of FIG. 7. In this context, "substantially conforms" shall mean that the pocket 14 is physically configured to receive and retain the die 12 such that the outer edges 16 of the die 12 are contiguous with the walls 18 of the pocket 14 so that the top surface 20 of the die 12 is coplanar with the top surface 22 of the pocket 14 when the die 12 is inserted into the pocket 14.

Figure 1:
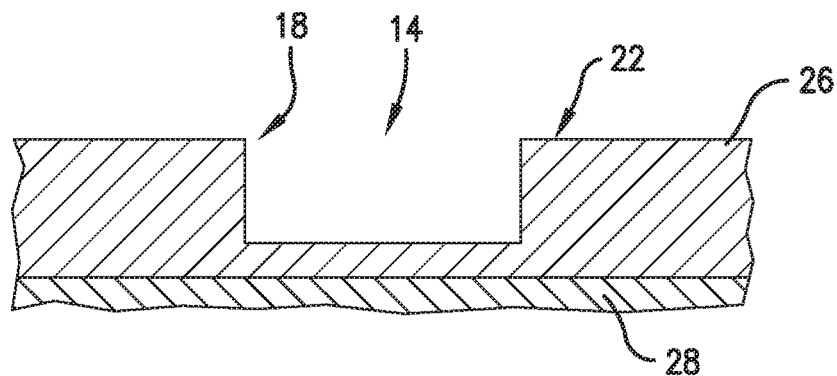
FIG. 1 is a fragmentary cross-sectional elevation view of a pocket created by removing material.

As shown in FIG. 1 and in 214 of FIG. 7, the pocket 14 may be formed by removing a sacrificial material from a support component 26. For example, a precision computer numeric control (CNC) machine may be used to mill the support component 26 to create the pocket 14. Alternatively, as shown in FIG. 4 and in 216 of FIG. 7, the pocket 14 may be formed by building-up the sacrificial material on the support component 26. In one implementation, the pocket 14 may be approximately between 0.5 and 10 millimeters square, or approximately between 1 and 4 millimeters square, or no more than approximately 10 millimeters square, and approximately between 50 and 5000 microns deep, or approximately between 50 and 500 microns deep, or no more than approximately 5000 millimeters deep. As used herein, the term "approximately" when used in connection with numerical ranges shall mean within plus or minus 10% of the stated numerical range, unless otherwise specifically defined. In an example, a pocket 14 may be 2 mm square and 300 microns deep. For comparison, the width of a typical human hair is 100 microns, so in this example, the depth of the pocket 14 may be less than the combined width of three human hairs.

The sacrificial material of the support component 26 may itself be rounded by the delayering process but protects the edges of the die 12 from being rounded during the delayering process. The sacrificial material of the support component 26 may be the same or relevantly similar to the material of the integrated circuit die 12 so that the delayering process affects the support component 26 and the integrated circuit die 12 identically or similarly, thereby preserving the physical and functional relationships between them (i.e., they are removed at the same rate). For example, if the material of the integrated circuit die 12 is silicon or includes silicon, then the sacrificial material of the support component 26 may be silicon or include silicon. In one implementation, a base 28 may underlie and support the sacrificial material of the support component 26. The base 28 may be constructed of substantially any suitable material, such as metal or glass.

Figure 2:
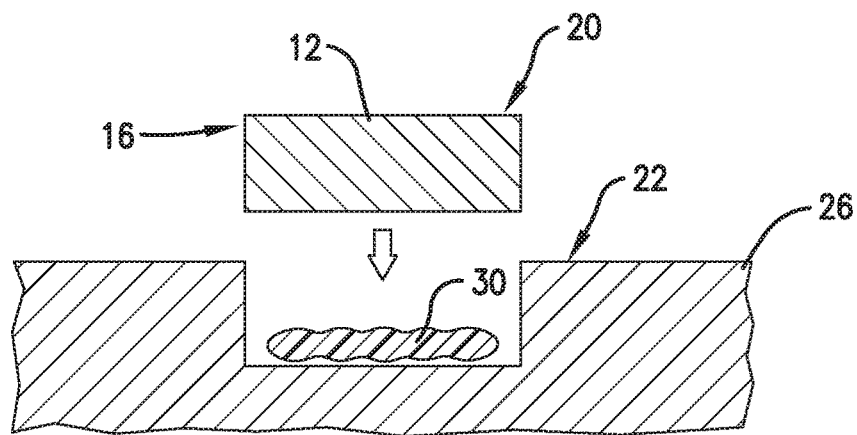
FIG. 2 is a fragmentary cross-sectional elevation view of an adhesive substance positioned within the pocket of FIG. 1, and an integrated circuit die being inserted into the pocket with the adhesive substance.
Figure 5:
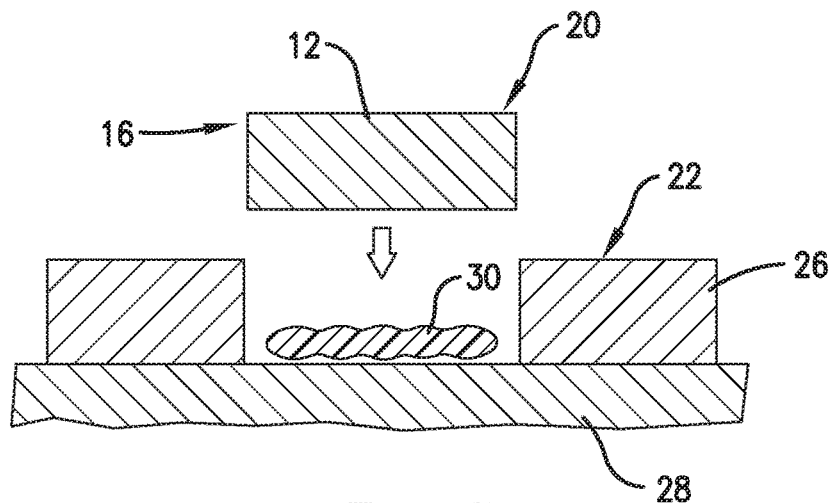
FIG. 5 is a fragmentary cross-sectional elevation view of an adhesive substance positioned within the pocket of FIG. 4, and an integrated circuit die being inserted into the pocket with the adhesive substance.

An adhesive substance 30 may be injected, inserted, or otherwise positioned in the pocket 14, as shown in 218 of FIG. 7 and in FIGS. 2 and 5. The adhesive substance 30 may be substantially any adhesive substance (e.g., wax, epoxy) which is suitable to aid in retaining the die 12 in the pocket 14. In one implementation, shown in 222 of FIG. 7, the adhesive substance 30 may be a wax or wax-like substance which is initially in a melted or semi-melted state and then cools and solidifies against an underside of the die 12, and thereby adheres to and secures the die 12 inside the pocket 14 in the desired position and a desired flat, or planar, orientation.

In one implementation, there is insufficient space between the edges 16 of the die 12 and the walls 18 of the pocket 14 for the adhesive substance 30 to migrate therebetween, and therefore the adhesive substance 30 is not exposed and is not removed during the delayering process. In another implementation, there is sufficient space between the edges 16 of the die 12 and the walls 18 of the pocket 14 for the adhesive substance 30 to migrate therebetween, and therefore the adhesive substance 30 is exposed and is removed during the delayering process. In the latter implementation, the adhesive substance 30 may have relevant properties similar to the sacrificial material of the support component 26 and the material of the die 12 such that the adhesive substance is removed at the same rate during the delayering process.

Figure 3:
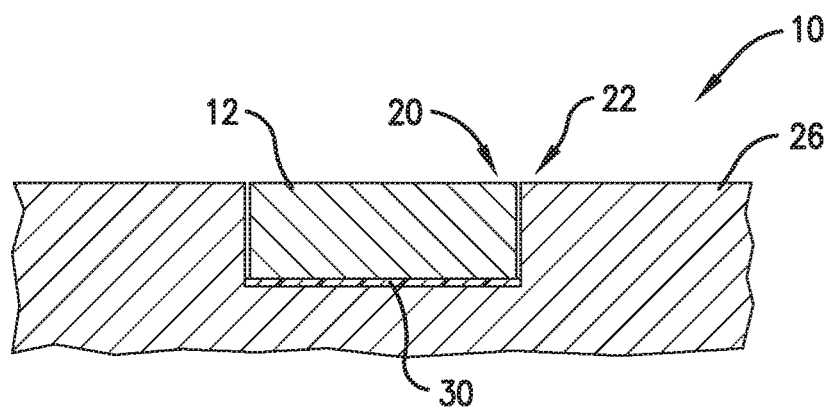
FIG. 3 is a fragmentary cross-sectional elevation view of a first embodiment of an apparatus for facilitating planar delayering of the integrated circuit die, wherein the integrated circuit die is fully inserted into the pocket of FIG. 1 and maintained in a desired position and orientation by the adhesive substance.

The die 12 may then be inserted into the pocket 14 and against the adhesive substance 30 so that the top surface 20 of the die 12 is coplanar with the top surface 22 of the pocket 14, as shown in 220 of FIG. 7 and in FIGS. 3 and 6. Once the die 12 is sufficiently secured within the pocket 14, the die 12 may be delayered, as shown in 224 of FIG. 7, along with the adjacent sacrificial material of the support component 26 without rounding the edges of the die 12.

Although the invention has been described with reference to the one or more embodiments illustrated in the figures, it is understood that equivalents may be employed and substitutions made herein without departing from the scope of the invention as recited in the claims.

Having thus described one or more embodiments of the invention, what is claimed as new and desired to be protected by Letters Patent includes the following:

1. An apparatus for removing one or more layers from a die for an integrated circuit, the apparatus comprising:
   a pocket created in a sacrificial material, wherein the pocket substantially conforms to a shape of the die such that when the die is inserted into the pocket and prior to the removal of any material, an edge of the die is contiguous with a wall of the pocket and a top surface of the die is coplanar with a top surface of the pocket; and
   a adhesive substance positioned in the pocket,
   the die inserted into the pocket and against the adhesive substance which adheres to a bottom of the die and aids in retaining the die in the pocket, wherein the one or more layers of the die defining the top surface of the die and one or more layers of the sacrificial material defining the top surface of the pocket and surrounding the die are removed without rounding the edges of the die.

2. The apparatus of claim 1, wherein the pocket is no more than ten millimeters square and no more than five thousand microns deep.

3. The apparatus of claim 1, wherein the pocket is created by removing an amount of the sacrificial material.

4. The apparatus of claim 1, wherein the pocket is created by building up an amount of the sacrificial material around the die.

5. The apparatus of claim 1, wherein the sacrificial material is a same material as the die.

6. The apparatus of claim 5, wherein the sacrificial material includes silicon.

7. The apparatus of claim 1, wherein the adhesive substance is a wax substance.

8. The apparatus of claim 7, wherein the wax substance is initially in an unsolidified state, and the die is maintained in a desired position and orientation within the pocket until the wax substance cools to a solidified state.

9. The apparatus of claim 1, further including a base underlying and supporting the sacrificial material.

10. An apparatus for removing one or more layers from a die for an integrated circuit, the apparatus comprising:
    a pocket created in a sacrificial material, wherein the sacrificial material is a same material as the die and includes silicon, and wherein the pocket substantially conforms to a shape of the die and is no more than ten millimeters square and no more than five thousand microns deep such that when the die is inserted into the pocket and prior to the removal of any material, an edge of the die is contiguous with a wall of the pocket and a top surface of the die is coplanar with a top surface of the pocket; and
    a adhesive substance positioned in the pocket,
    the die inserted into the pocket and against the adhesive substance which adheres to a bottom of the die and aids in retaining the die in the pocket, wherein the one or more layers of the die defining the top surface of the die and one or more layers of the sacrificial material defining the top surface of the pocket and surrounding the die are removed without rounding the edges of the die.

11. An apparatus for removing one or more layers from a die for an integrated circuit, the apparatus comprising:
    a pocket created in a sacrificial material by removing an amount of the sacrificial material, wherein the sacrificial material is a same material as the die, wherein the pocket is no more than ten millimeters square and no more than five thousand microns deep, and wherein the pocket substantially conforms to a shape of the die such that when the die is inserted into the pocket and prior to the removal of any material, an edge of the die is contiguous with a wall of the pocket and a top surface of the die is coplanar with a top surface of the pocket;
    a wax substance positioned in the pocket, wherein the wax substance is initially in an unsolidified state;
    the die inserted into the pocket and against the wax substance and maintained in a desired position and orientation within the pocket until the wax substance cools to a solidified state and adheres to a bottom of the die and aids in retaining the die in the pocket, wherein the one or more layers of the die defining the top surface of the die and one or more layers of the sacrificial material defining the top surface of the pocket and surrounding the die are removed without rounding the edges of the die.

12. The apparatus of claim 11, wherein the sacrificial material includes silicon.

* * * * *